(12) United States Patent
Kikuchi

(10) Patent No.: US 12,269,736 B2
(45) Date of Patent: Apr. 8, 2025

(54) METHOD FOR FABRICATING IMPRINT MASTER, THE IMPRINT MASTER, IMPRINT AND ARTICLE

(71) Applicant: Dexerials Corporation, Shimotsuke (JP)

(72) Inventor: Masanao Kikuchi, Shimotsuke (JP)

(73) Assignee: Dexerials Corporation, Shimotsuke (JP)

( * ) Notice: Subject to any disclaimer, the term of this patent is extended or adjusted under 35 U.S.C. 154(b) by 180 days.

(21) Appl. No.: 17/906,863

(22) PCT Filed: Mar. 17, 2021

(86) PCT No.: PCT/JP2021/010894
§ 371 (c)(1),
(2) Date: Sep. 21, 2022

(87) PCT Pub. No.: WO2021/193297
PCT Pub. Date: Sep. 30, 2021

(65) Prior Publication Data
US 2023/0128723 A1 Apr. 27, 2023

(30) Foreign Application Priority Data
Mar. 27, 2020 (JP) ................................. 2020-057913

(51) Int. Cl.
*B29C 33/00* (2006.01)
*B29C 33/42* (2006.01)
*B81C 99/00* (2010.01)

(52) U.S. Cl.
CPC .......... *B81C 99/009* (2013.01); *B29C 33/424* (2013.01); *B81C 99/0085* (2013.01)

(58) Field of Classification Search
CPC .... G02B 5/045; G02B 6/0036; G02B 6/0045; G02B 6/0065; B29C 33/00
See application file for complete search history.

(56) References Cited

U.S. PATENT DOCUMENTS

2017/0299778 A1   10/2017  Kajiya et al.
2021/0191024 A1*   6/2021  Kajiya .................. G02B 5/045

FOREIGN PATENT DOCUMENTS

JP          H107144363 A     6/1995
JP          2006519711 A     8/2006
                (Continued)

OTHER PUBLICATIONS

Jun. 8, 2021, International Search Report issued in the International Patent Application No. PCT/JP2021/010894.
(Continued)

*Primary Examiner* — Thu Khanh T. Nguyen
(74) *Attorney, Agent, or Firm* — KENJA IP LAW PC

(57) ABSTRACT

A method for fabricating an imprint master 1 comprises a first forming step of forming micro-protrusion-and-recess structures 23 having a first average pitch on one surface of a substrate 10 and a second forming step of forming main recesses 21 or main protrusions 22 having a second average pitch larger than the first average pitch on the one surface of the substrate 10 having the micro-protrusion-and-recess structures 23 formed thereon, in a manner maintaining a shape of at least a portion of the micro-protrusion-and-recess structures 23 in the main recesses 21 or the main protrusions 22 while the main recesses 21 or the main protrusions 22 are being formed.

2 Claims, 15 Drawing Sheets

(56) References Cited

FOREIGN PATENT DOCUMENTS

| | | |
|---|---|---|
| JP | 2008126448 A | 6/2008 |
| JP | 2016028867 A | 3/2016 |
| JP | 2016051116 A | 4/2016 |
| JP | 2016190418 A | 11/2016 |
| JP | 2019111786 A | 7/2019 |
| JP | 2020017591 A | 1/2020 |
| TW | 201620692 A | 6/2016 |

OTHER PUBLICATIONS

Mar. 15, 2024, Office Action issued by the Korean Intellectual Property Office in the corresponding Korean Patent Application No. 10-2022-7026500.
Mar. 26, 2024, the Extended European Search Report issued by the European Patent Office in the corresponding European Patent Application No. 21774309.5.
Sep. 22, 2022, International Preliminary Report on Patentability issued in the International Patent Application No. PCT/JP2021/010894.
Jun. 18, 2024, Office Action issued by the Taiwan Intellectual Property Office in the corresponding Taiwanese Patent Application No. 110110361.
Nov. 20, 2024, Office Action issued by the Korean Intellectual Property Office in the corresponding Korean Patent Application No. 10-2022-7026500.

\* cited by examiner

METHOD FOR FABRICATING IMPRINT MASTER, THE IMPRINT MASTER, IMPRINT AND ARTICLE

CROSS REFERENCE TO RELATED APPLICATION

This application claims priority to and the benefit of Japanese Patent Application No. 2020-057913 filed on Mar. 27, 2020, the entire contents of which are incorporated herein by reference.

TECHNICAL FIELD

The present disclosure relates to a method for fabricating an imprint master, the imprint master, an imprint and an article.

BACKGROUND

In recent years, a nanoimprint technology has been developed as one of microfabrication techniques, in which a planar, columnar or cylindrical imprint master with a surface having a fine pattern formed thereon is pressed against a resin sheet or the like to imprint the fine pattern formed on the imprint master to the resin sheet or the like.

For example, Patent Literature 1 and 2 describe techniques to form a protrusion-and-recess structure in a predetermined pattern on a substrate by forming an etching mask on the substrate by lithography and then etching the substrate with the etching mask formed thereon.

CITATION LIST

Patent Literature

PTL 1: JP2016-28867A
PTL 2: JP2019-111786A

SUMMARY

Technical Problem

In some cases various articles such as a light guide plate, a light diffuser, a microlens array, an anti-glare (AG: Anti-Glare) film, a cell culture sheet and the like are required to have excellent optical performance with respect to each of different wavelengths of light (e.g., visible light and light with a longer wavelength than that of visible light). In order to meet such requirements, it is conceivable to superimpose protrusion-and-recess structures with average pitches corresponding to the respective wavelengths of light and imprint the protrusion-and-recess structures to a resin sheet or the like by a nanoimprint technology. However, the techniques described in Patent Literature 1 and 2 simply form protrusion-and-recess structures in approximately constant shapes and have difficulty in forming a protrusion-and-recess structure by superimposing protrusion-and-recess structures with different average pitches on one another as described above.

In view of the above problem, the present disclosure aims to provide a method for fabricating an imprint master having a protrusion-and-recess structure in which protrusion-and-recess structures with different average pitches are superimposed on one another, the imprint master, an imprint and an article.

Solution to Problem

A method for fabricating an imprint master according to one embodiment includes a first forming step of forming micro-protrusion-and-recess structures having a first average pitch on one surface of a substrate and a second forming step of forming main recesses or main protrusions having a second average pitch larger than the first average pitch on the one surface of the substrate having the micro-protrusion-and-recess structures formed thereon, in a manner maintaining a shape of at least a portion of the micro-protrusion-and-recess structures in the main recesses or the main protrusions while the main recesses or the main protrusions are being formed.

An imprint master according to one embodiment includes a substrate with one surface having main recesses or main protrusions formed thereon in which micro-protrusion-and-recess structures are formed. The micro-protrusion-and-recess structures are formed at a first average pitch, and the main recesses or the main protrusions are formed at a second average pitch larger than the first average pitch.

An imprint according to one embodiment has a shape or an inverse shape of the protrusion-and-recess structures formed on the one surface of the substrate of the imprint master described above imprinted thereto.

An article according to one embodiment includes the imprint described above.

Advantageous Effect

The present disclosure can provide a method for fabricating an imprint master having a protrusion-and-recess structure in which protrusion-and-recess structures with different average pitches are superimposed on one another, the imprint master, an imprint and an article.

DETAILED DESCRIPTION

Hereinafter, embodiments for practicing the present disclosure will be described with reference to the drawings. The same reference signs in each of the drawings refer to the same or equivalent elements.

Figure 1:
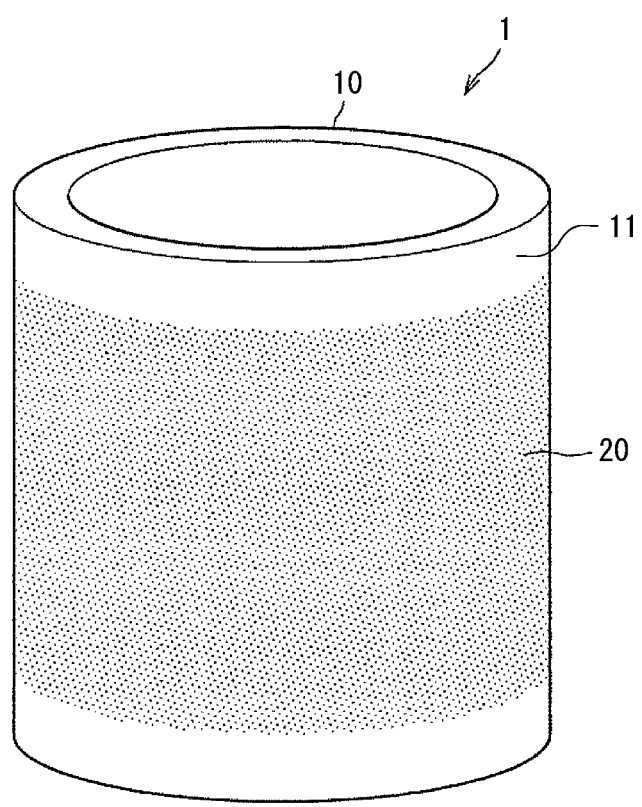
FIG. 1 is a schematic diagram illustrating an exterior of an imprint master according to one embodiment of the present disclosure.

FIG. 1 is a diagram illustrating an exterior of an imprint master 1 according to one embodiment of the present disclosure.

As illustrated in FIG. 1, the imprint master 1 according to the present embodiment includes a substrate 10 in a columnar shape having, for example, a peripheral surface 11 serving as one surface on which a protrusion-and-recess structure 20 is formed.

The imprint master 1 is, for example, an imprint master to be used for a roll-to-roll imprint technology. In the roll-to-roll imprint technology, the peripheral surface 11 of the imprint master 1 is pressed against a sheet-like substrate or the like while the imprint master 1 is rotated, whereby the protrusion-and-recess structure 20 formed on the peripheral surface 11 of the imprint master 1 can be imprinted to the sheet-like substrate or the like. Such an imprint technology enables efficient manufacture of an imprint having the protrusion-and-recess structure 20 formed on the peripheral surface 11 of the imprint master 1 imprinted thereto.

The imprint having the protrusion-and-recess structure 20 imprinted thereto has a variety of applications. For example, the imprint having the protrusion-and-recess structure 20 imprinted thereto can be used for articles including a light guide plate, a light diffuser, a microlens array, an anti-glare film, a cell culture sheet and the like. The substrate 10 is, for example, a cylindrical or columnar member. The shape of the substrate 10 may be a hollow cylindrical shape with an interior cavity, as illustrated in FIG. 1. The shape of the substrate 10 may be a solid cylindrical shape without an interior cavity. The substrate 10 may be a planar member. The substrate 10 may be formed of a glass material mainly composed of $SiO_2$, such as fused quartz glass or synthetic quartz glass. The substrate 10 may be formed of a metal, such as stainless steel. The peripheral surface 11 of the substrate 10 may be coated with $SiO_2$ or the like. In the following description, the substrate 10 will be considered to be a cylindrical or columnar member.

Preferably, at least the peripheral surface 11 of the substrate 10 is formed of the glass material mainly composed of $SiO_2$. More preferably, the substrate 10 is formed of the glass material mainly composed of $SiO_2$ in its entirety. In a case in which the substrate 10 is mainly composed of $SiO_2$, the substrate 10 can be easily processed by etching with a fluorine compound. For example, by performing etching with a fluorine compound using a resist layer having a pattern corresponding to the protrusion-and-recess structure 20 formed thereon as a mask pattern, the protrusion-and-recess structure 20 can be easily formed on the peripheral surface 11 of the substrate 10.

In a case in which the substrate 10 has a columnar shape, the substrate 10 may have, for example, a height (a length in an axial direction) of 100 mm or more and a diameter of 50 mm to 300 mm (a radial length perpendicular to the axial direction) of a circumference of a bottom or top surface of the cylindrical shape. In a case in which the substrate 10 has a cylindrical shape, a radial thickness thereof may be between 2 mm and 50 mm. However, the substrate 10 is not limited to the above size.

Figure 2A:
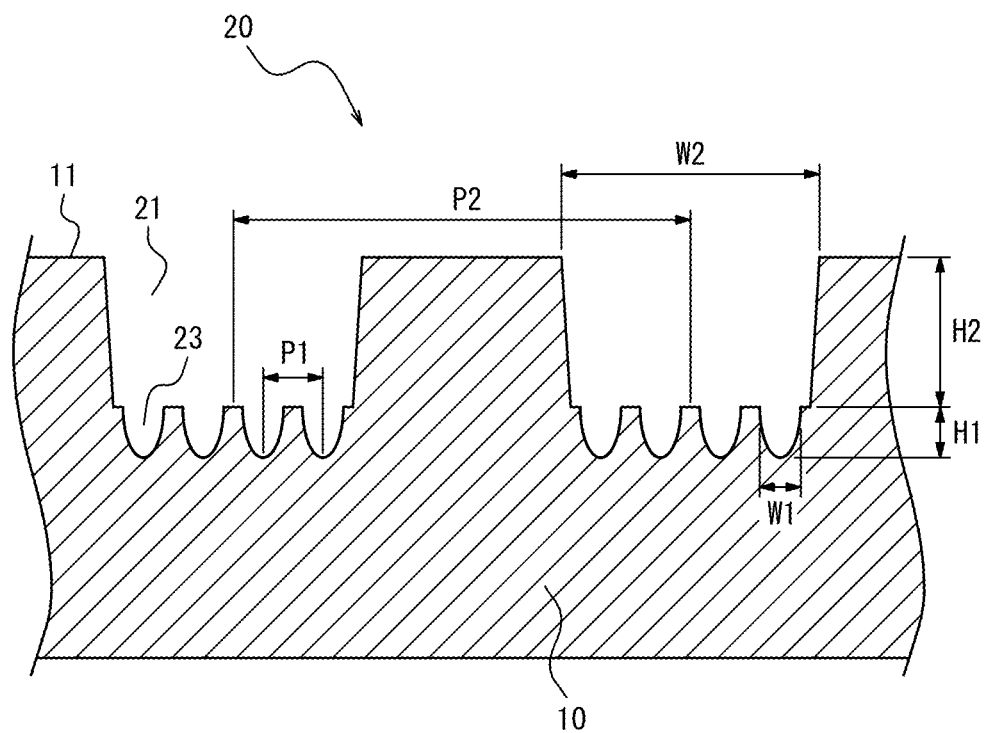
FIG. 2A is a diagram illustrating an example of a protrusion-and-recess structure formed on a peripheral surface of the imprint master illustrated in FIG. 1.

The protrusion-and-recess structure 20 is formed on the peripheral surface 11 serving as one surface of the substrate 10. FIG. 2A illustrates an example of the protrusion-and-recess structure 20.

As illustrated in FIG. 2A, the protrusion-and-recess structure 20 includes main recesses 21 formed on the peripheral surface 11 serving as one surface of the substrate 10, and micro-protrusion-and-recess structures 23 formed in the main recesses 21.

The main recesses 21 have a structure depressed from the peripheral surface 11 of the substrate 10 in a radially inward direction of the substrate 10. The main recesses 21 have a predetermined average pitch P2 (a second average pitch) therebetween. The average pitch P2 of the main recesses 21 is a statistical average of a distance between the main recesses 21 adjacent to each other within a predetermined range (e.g., a distance between centers of the main recesses 21 adjacent to each other).

The micro-protrusion-and-recess structures 23 are formed in the main recess 21. In particular, the micro-protrusion-and-recess structures 23 are formed in the vicinity of a bottom surface of the main recess 21. The micro-protrusion-and-recess structures 23 have a predetermined average pitch P1 (a first average pitch) therebetween. The average pitch P1 of the micro-protrusion-and-recess structures 23 is a statistical average of a distance between adjacent protrusion-and-recesses forming the micro-protrusion-and-recess structures within a predetermined range.

A plurality of the main recesses 21 having the micro-protrusion-and-recess structures 23 formed in the vicinity of the bottom surface thereof as illustrated in FIG. 2A are formed either regularly or irregularly on the substrate 10.

The average pitch P1 of the micro-protrusion-and-recess structures 23 is, for example, equal to or smaller than the wavelength of visible light. The average pitch P2 of the main recesses 21 is, for example, larger than the wavelength of visible light. Therefore, the average pitch P2 of the main recesses 21 is larger than the average pitch P1 of the micro-protrusion-and-recess structures 23.

A depth H1 of a recess forming the micro-protrusion-and-recess structure 23 is within a range of, for example, approximately 50 nm to 300 nm. A width W1 of an opening of the recess forming the micro-protrusion-and-recess structure 23 is within a range of, for example, approximately 50 nm to 500 nm. A depth H2 of the main recess 21 is within a range of, for example, approximately 1 μm to 20 μm. Further, a width W2 of an opening of the main recess 21 is within a range of, for example, approximately 5 μm to 200 μm. Accordingly, the size of the micro-protrusion-and-recess structure 23 is approximately 1/10 to 1/4000 of the size of the main recess 21. Therefore, 100 to 16 million units of a recess and a protrusion making up of the micro-protrusion-and-recess structure 23 can be formed in one main recess 21.

Figure 2B:
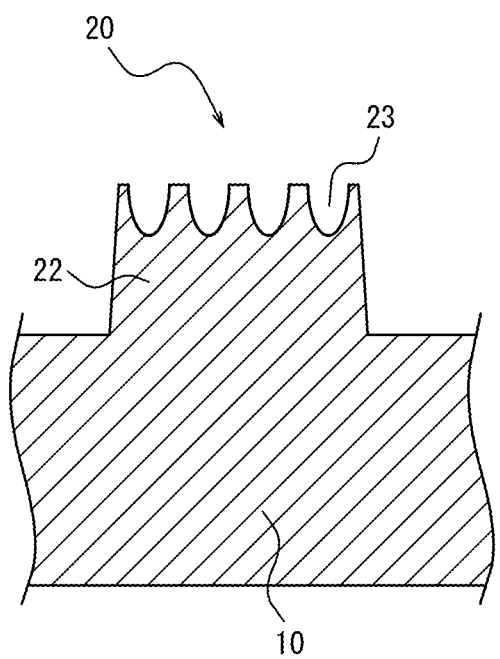
FIG. 2B is a diagram illustrating another example of the protrusion-and-recess structure formed on the peripheral surface of the imprint master illustrated in FIG. 1.

Although FIG. 2A illustrates an example of the protrusion-and-recess structure 20 in which the micro-protrusion-and-recess structures 23 are formed in the vicinity of the bottom surface of the main recess 21, this is not restrictive. As illustrated in FIG. 2B, the protrusion-and-recess structure 20 may have a structure in which the micro-protrusion-and-recess structures 23 are formed in the vicinity of a top surface of a main protrusion 22 protruding in a radially outward direction of the substrate 10. In this case, a plurality of the main protrusions 22 having the micro-protrusion-and-recess structures 23 formed in the vicinity of the top surface thereof as illustrated in FIG. 2B are formed either regularly or irregularly on the substrate 10.

As described above, the imprint master 1 includes the substrate 10 having the main recesses 21 or the main protrusions 22 formed on the peripheral surface 11 serving as one surface and the micro-protrusion-and-recess structures 23 formed in the main recesses 21 or the main protrusions 22. The micro-protrusion-and-recess structures 23 are formed at the average pitch P1 (the first average pitch), and the main recesses 21 or the main protrusions 22 are formed at the average pitch P2 (the second average pitch) larger than the average pitch P1 of the micro-protrusion-and-recess structures 23. That is, the imprint master 1 includes the substrate 10 having a plurality of main recesses 21 or main protrusions 22 formed at the average pitch P2 on the peripheral surface 11 and the micro-protrusion-and-recess structures 23 formed at the average pitch P1 (P1<P2) in each of the main recesses 21 or the main protrusions 22. Thus, the imprint master 1 has the protrusion-and-recess structures with different average pitches formed thereon in a manner being superimposed on one another.

According to the present embodiment, the micro-protrusion-and-recess structure 23 is formed solely in the main recess 21 or the main protrusion 22, as illustrated in FIG. 2A and FIG. 2B. That is, the micro-protrusion-and-recess structure 23 is not formed in any areas other than the main recess 21 or the main protrusion 22. Since the micro-protrusion-and-recess structure 23 is formed solely in the main recess 21 or the main protrusion 22 as described above, a micro-protrusion-and-recess structure such as, for example, a moth-eye-like structure can be formed to locally provide an antireflection effect. Further, different wettability due to the presence and absence of the micro-protrusion-and-recess structure can be applied to a patterning of printing ink (Wenzel model).

Figure 3:
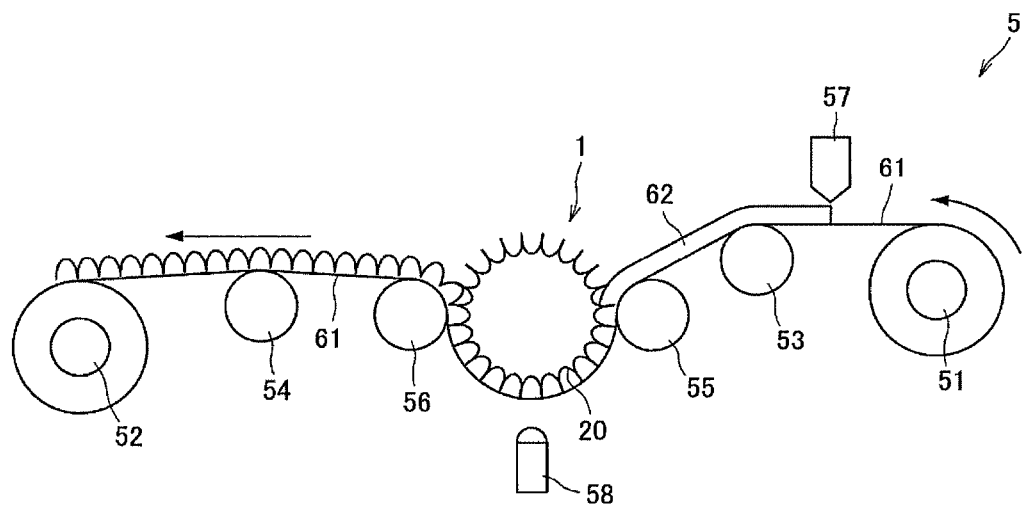
FIG. 3 is a diagram illustrating an example configuration an imprint apparatus configured to manufacture an imprint using the imprint master illustrated in FIG. 1.

Next, an example use of the imprint master 1 according to the present embodiment will be described. By using the imprint master 1 of the present embodiment, an imprint having a shape of the protrusion-and-recess structure 20 formed on the peripheral surface 11 of the imprint master 1 imprinted thereto can be manufactured. FIG. 3 is a diagram illustrating an example configuration of an imprint apparatus 5 configured to manufacture an imprint using the imprint master 1 of the present embodiment.

As illustrated in FIG. 3, the imprint apparatus 5 includes the imprint master 1, a substrate supply roll 51, a take-up roll 52, guide rolls 53, 54, a nip roll 55, a peeling roll 56, a coating apparatus 57 and a light source 58. The imprint apparatus 5 illustrated in FIG. 3 is a roll-to-roll imprint apparatus.

The substrate supply roll 51 is, for example, a roll in which a sheet-like substrate 61 is rolled up. The take-up roll 52 is a roll configured to wind up an imprint having a resin layer 62 laminated thereon to which the protrusion-and-recess structure 20 of the imprint master 1 is imprinted. The guide rolls 53, 54 are rolls configured to convey the sheet-like substrate 61 before and after imprinting. The nip roll 55 is a roll configured to press the sheet-like substrate 61 having the resin layer 62 laminated thereon against the imprint master 1. The peeling roll 56 is a roll configured to peel the sheet-like substrate 61 having the resin layer 62 laminated thereon off from the imprint master 1 after the protrusion-and-recess structure 20 is imprinted to the resin layer 62.

The coating apparatus 57 is provided with a coating means such as a coater and is configured to apply a photocurable resin composition to the sheet-like substrate 61 to form the resin layer 62. The coating apparatus 57 may be, for example, a gravure coater, a wire bar coater or a die coater. The light source 58 is a light source configured to emit light with a wavelength capable of curing the photocurable resin composition. The light source 58 may be, for example, a UV lamp.

The photocurable resin composition is a resin that cures when irradiated with light with a predetermined wavelength. The photocurable resin composition may be, for example, a UV-curable resin such as an acrylic acrylate resin or an epoxy acrylate resin. The photocurable resin composition may contain a polymerization initiator, a filler, a functional additive, a solvent, an inorganic material, a pigment, an antistatic agent, a sensitizing dye or the like, as necessary.

The resin layer 62 may be formed of a thermosetting resin composition. In this case, the imprint apparatus 5 includes a heater in lieu of the light source 58. When the resin layer 62 is heated by the heater, the resin layer 62 can be cured and the protrusion-and-recess structure 20 can be imprinted. The thermosetting resin composition may be, for example, a phenol resin, an epoxy resin, a melamine resin, a urea resin or the like.

In the imprint apparatus 5 illustrated in FIG. 3, the sheet-like substrate 61 is continuously fed out from the substrate supply roll 51 via the guide roll 53. The coating apparatus 57 applies the photocurable resin composition to the sheet-like substrate 61 being conveyed such that the resin layer 62 is laminated on the sheet-like substrate 61. The sheet-like substrate 61 having the resin layer 62 laminated thereon is pressed against the imprint master 1 by the nip roll 55. In this way, the protrusion-and-recess structure 20 formed on the peripheral surface 11 of the imprint master 1 is imprinted to the resin layer 62. The resin layer 62 having the protrusion-and-recess structure 20 imprinted thereto is cured by light irradiated from the light source 58. As a result, an inverse structure of the protrusion-and-recess structure 20 of the imprint master 1 is formed on the resin layer 62. The sheet-like substrate 61 having the protrusion-and-recess structure 20 imprinted thereto is peeled off from the imprint master 1 by the peeling roll 56 and sent to the take-up roll 52 via the guide roll 54 to be wound up.

The imprint apparatus 5 as described above can efficiently imprint the protrusion-and-recess structure 20 formed on the peripheral surface 11 of the imprint master 1 to the sheet-like substrate 61. Note that the protrusion-and-recess structure formed on the imprint having the protrusion-and-recess structure 20 imprinted thereto may be used for further imprinting to manufacture an imprint having the same protrusion-and-recess structure as the imprint master 1. That is, the imprint manufactured with the imprint master 1 of the present embodiment includes an imprint having the shape of the protrusion-and-recess structure 20 formed on the peripheral surface 11 serving as one surface of the substrate 10 of the imprint master 1 imprinted thereto, as well as an imprint having an inverse shape of the protrusion-and-recess structure 20 imprinted thereto (i.e., an imprint having the same protrusion-and-recess structure as the imprint master 1). The imprint having the same protrusion-and-recess structure as the imprint master 1 may be used as, for example, a replicated imprint master.

Next, a method for fabricating the imprint master 1 according to the present embodiment will be described.

In the present embodiment, a latent image is formed by exposing the resist layer deposited on the peripheral surface 11 of the imprint master 1 in a lithographic process, and then the substrate 10 is etched using the resist layer developed after the formation of the latent image as an etching mask to form the protrusion-and-recess structure 20 on the substrate 10. Hereinafter, a configuration of an exposure apparatus 3 configured to expose the resist layer as described above will be described with reference to FIG. 4.

Figure 4:
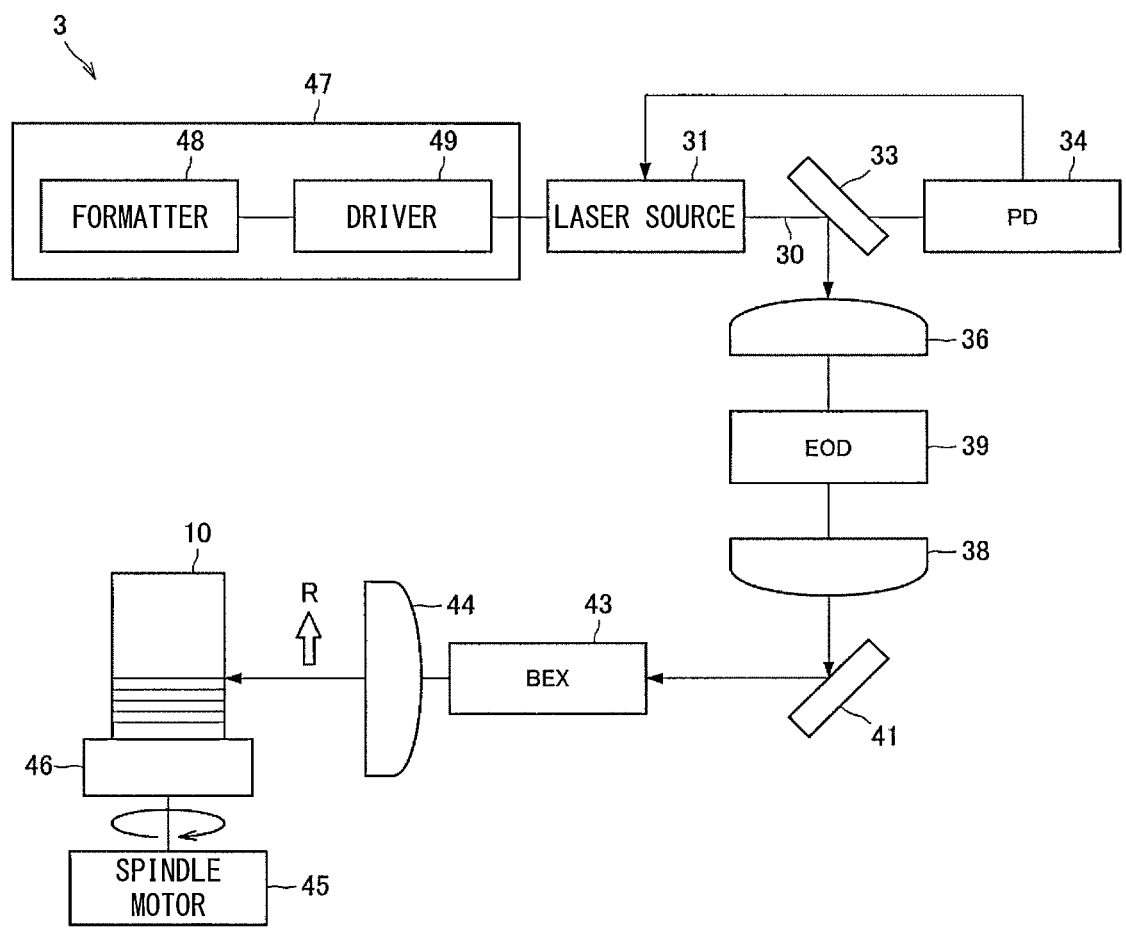
FIG. 4 is a diagram illustrating an example configuration of an exposure apparatus used for fabrication of the imprint master illustrated in FIG. 1.

As illustrated in FIG. 4, the exposure apparatus 3 includes a laser source 31, a first mirror 33, a photodiode (Photo Diode: PD) 34, a condensing lens 36, a collimating lens 38, an electro-optic deflector (Electro-Optic Deflector: EOD) 39, a second mirror 41, a beam expander (Beam expander: BEX) 43 and an objective lens 44.

The laser source 31 is controlled by an exposure signal generated by a control mechanism 47. A laser beam 30 emitted from the laser source 31 irradiates the substrate 10 arranged on a turntable 46. The turntable 46 having the substrate 10 arranged thereon is rotated by a spindle motor 45 controlled by a rotation control signal synchronized with the exposure signal.

The laser source 31 is a light source configured to irradiate the laser beam 30 to expose the resist layer deposited on the peripheral surface 11 of the substrate 10. The laser source 31 may be, for example, a semiconductor laser source configured to irradiate a laser beam with a wavelength that belongs to the blue light band of 400 nm to 500 nm. The laser beam 30 irradiated from the laser source 31 travels straight as a collimated beam and is reflected by the first mirror 33.

The laser beam 30 reflected by the first mirror 33 is focused to the electro-optic deflector 39 by the condensing lens 36 and then formed into the collimated beam again by the collimating lens 38. The laser beam 30 formed into the collimated beam is reflected by the second mirror 41 and guided horizontally to the beam expander 43.

The first mirror 33 includes a polarizing beam splitter and has a function of reflecting a portion of polarized light while allowing transmission of the other portion therethrough. The polarized light having transmitted through the first mirror 33 is photoelectrically converted by the photodiode 34 into a light receiving signal which is to be input to the laser source 31. This allows the laser source 31 to adjust the output of the laser beam 30 based on a feedback provided by the light receiving signal having been input.

The electro-optic deflector 39 is an element capable of controlling an irradiation position of the laser beam 30 by a distance of approximately a nanometer. Because of the electro-optic deflector 39, the exposure apparatus 3 can finely adjust the irradiation position of the laser beam 30 to be irradiated to the substrate 10.

The beam expander 43 is configured to shape the laser beam 30 guided by the second mirror 41 into a desired beam shape such that the laser beam 30 irradiates the resist layer deposited on the peripheral surface 11 of the substrate 10 through the objective lens 44.

The turntable 46 is configured to support the substrate 10 and to be rotated by the spindle motor 45 to rotate the substrate 10. The turntable 46 moves the irradiation position of the laser beam 30 in the axial direction of the substrate 10 (i.e., a direction indicated by an arrow R) while rotating the substrate 10 and thus can expose the peripheral surface 11 of the substrate 10 in a spiral manner. The movement of the irradiation position of the laser beam 30 may be performed by shifting a laser head including the laser source 31 along a slider.

The control mechanism 47 is configured to control the laser source 31 to control an output intensity and the irradiation position of the laser beam 30. The control mechanism 47 includes a formatter 48 and a driver 49.

The driver 49 is configured to control the irradiation of the laser beam 30 from the laser source 31 based on an exposure signal generated by the formatter 48. For example, the driver 49 may control the laser source 31 such that the output intensity of laser beam 30 increases in proportion to an amplitude of a waveform of the exposure signal. The driver 49 may control an irradiation timing of the laser beam 30 based on a shape of the waveform of the exposure signal to control the irradiation position of the laser beam 30. As the output intensity of the laser beam 30 increases, a size and a depth of the latent image formed in the resist layer can be increased.

The spindle motor 45 is configured to rotate the turntable 46 based on the rotation control signal. The spindle motor 45 may control the rotation such that the turntable 46 makes one rotation upon input of a predetermined number of pulses by the rotation control signal. The rotation control signal can be generated from a reference clock signal common to the exposure signal to synchronize with the exposure signal.

The exposure apparatus 3 illustrated in FIG. 4 can form a latent image in any pattern on the peripheral surface 11 of the substrate 10 with high precision and high reproducibility.

Next, a method for fabricating the imprint master 1 according to the present embodiment will be described. In the method for fabricating the imprint master 1 according to the present embodiment, a combination of the formation of an etching mask by exposing and developing an inorganic resist layer by thermal lithography and the formation of an etching mask by exposing and developing an organic resist layer by optical lithography is employed to form the protrusion-and-recess structure 20 described above having two recess-protruding patterns with different average pitches superimposed on one another on the peripheral surface 11 of the imprint master 1. For comparison, first, a method for fabricating an imprint master in which an etching mask is formed by exposing and developing the organic resist layer by optical lithography will be described with reference to FIG. 5A to FIG. 5D.

Figure 5A:
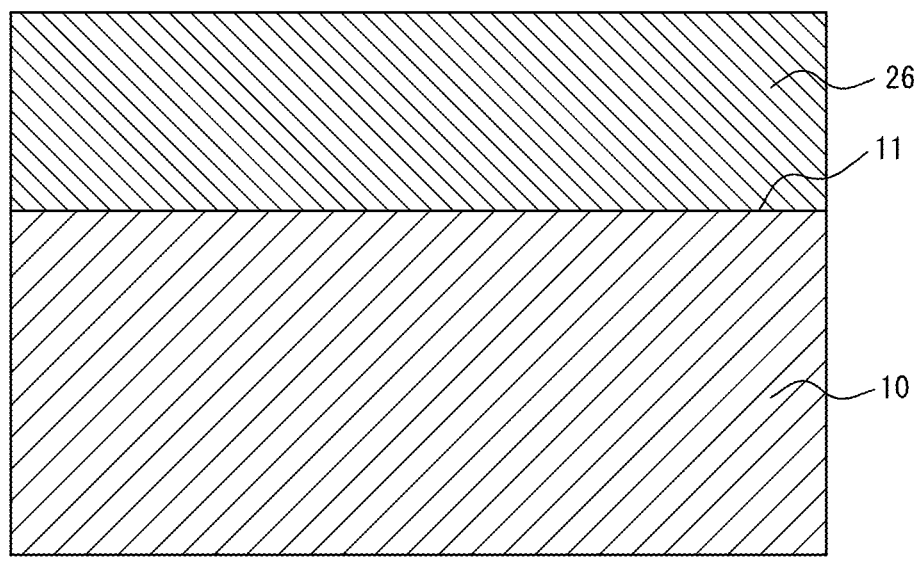
FIG. 5A is a cross-sectional view (No. 1) illustrating a method for fabricating an imprint master according to a comparative example 1.

An organic resist layer 26 formed of an organic material is deposited on the peripheral surface 11 serving as one surface of the substrate 10, as illustrated in FIG. 5A. The organic material forming the organic resist layer 26 may be, for example, a novolak resist or a chemically amplified resist. The organic materials as described above can be deposited as the organic resist layer 26 by, for example, a spin-coating method. In the present embodiment, the organic resist layer 26 is a positive resist.

Figure 5B:
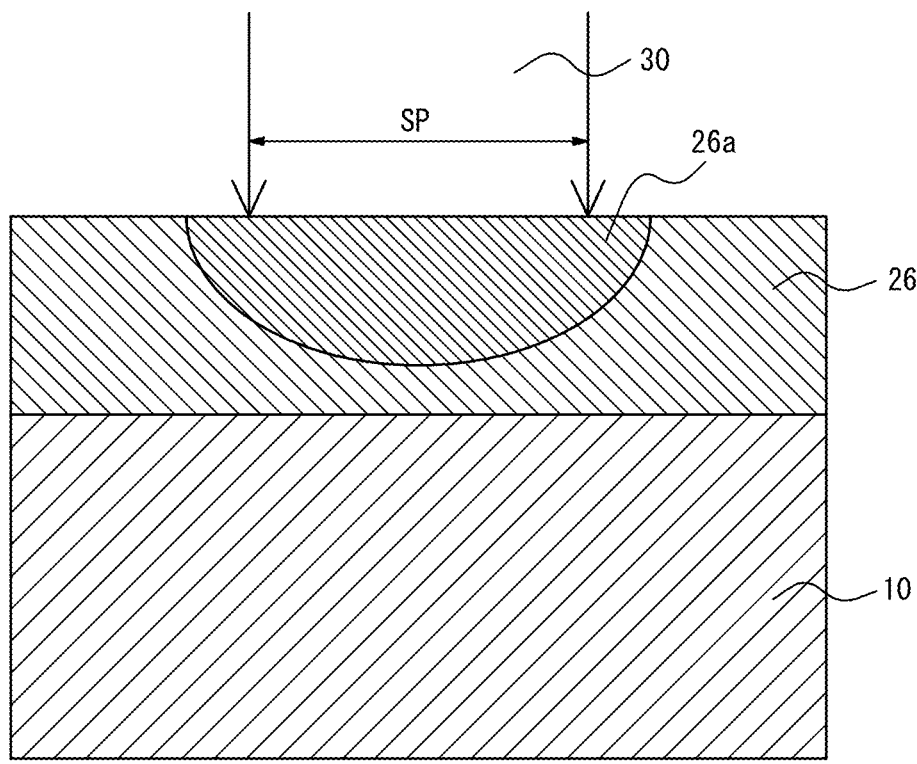
FIG. 5B is a cross-sectional view (No. 2) illustrating the method for fabricating the imprint master according to the comparative example 1.

Subsequently, the organic resist layer 26 deposited on the peripheral surface 11 of the substrate 10 is irradiated with the laser beam 30 and exposed by optical lithography, as illustrated in FIG. 5B. The exposure can be performed using the exposure apparatus 3 described with reference to FIG. 4. During the optical lithography, the organic resist layer 26 is changed in quality by irradiation of the laser beam 30 to form a latent image 26a. The wavelength of the laser beam 30 is not restrictive but may be within the blue light band of 400 nm to 500 nm. By modulating the control signal of the laser beam 30, the output intensity and the irradiation position of the laser beam 30 can be controlled, whereby the size and the position of the latent image 26a formed in the organic resist layer 26 can be adjusted. Therefore, the light source configured to irradiate the laser beam 30 may be, for example, a semiconductor laser source whose output can be easily adjusted.

Since the intensity of the light is greater as it is closer to a center of a spot SP (an irradiation area) of the laser beam 30 being radiated, a depth of the latent image 26a is deeper as it is closer to the center of the spot SP of the laser beam 30, as illustrated in a cross-sectional view of FIG. 5B. That is, the latent image 26a is formed in a semicircular shape. In addition to the area of the organic resist layer 26 corresponding to the spot SP, an area of the organic resist layer 26 surrounding the area corresponding to the spot SP is also exposed. Therefore, an area of the latent image 26a is larger than an area of the spot SP of the laser beam 30.

Figure 5C:
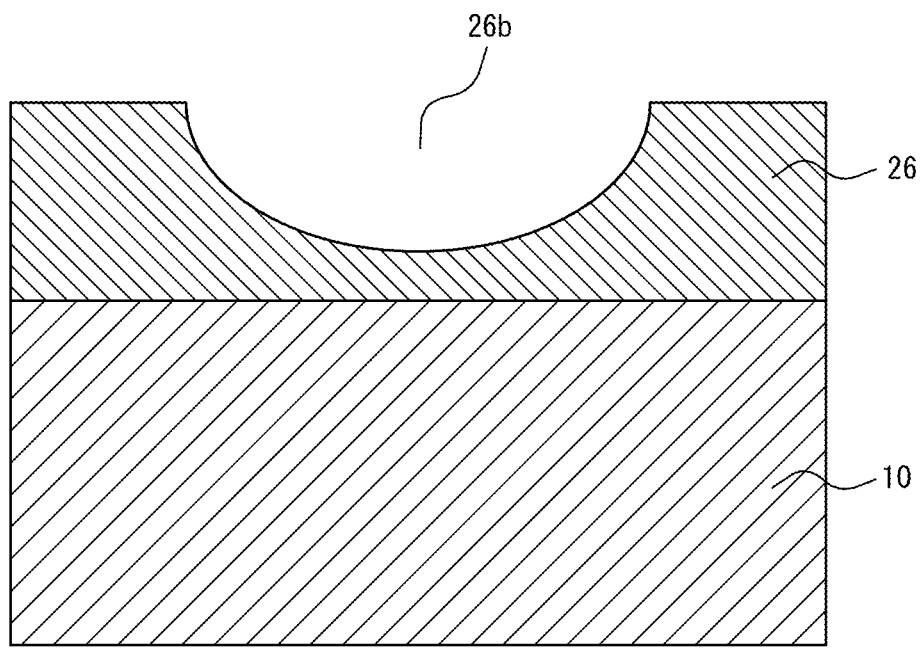
FIG. 5C is a cross-sectional view (No. 3) illustrating the method for fabricating the imprint master according to the comparative example 1.

Next, the organic resist layer 26 having the latent image 26a formed therein is developed to form a recess 26b corresponding to the latent image 26a in the organic resist layer 26, as illustrated in FIG. 5C. To develop the organic resist layer 26, an alkaline solution such as TMAH (TetraMethylAmmonium Hydroxide) aqueous solution, or various organic solvents such as an ester or an alcohol can be used. In a case in which the organic resist layer 26 is the positive resist, an exposed area exposed by the laser beam 30 has a faster dissolution speed with respect to a developing solution than that of an unexposed area that is not exposed by the laser beam 30. Therefore, the exposed area is removed by a development process. As a result, the organic resist layer 26 from which the latent image 26a is removed is formed. In a case in which the organic resist layer 26 is a negative resist, the exposed area exposed by the laser beam 30 has a slower dissolution speed with respect to the developing solution than that of the unexposed area that is not exposed by the laser beam 30. Therefore, the unexposed area is removed by a development process. As a result, the latent image 26a can be remained.

Figure 5D:
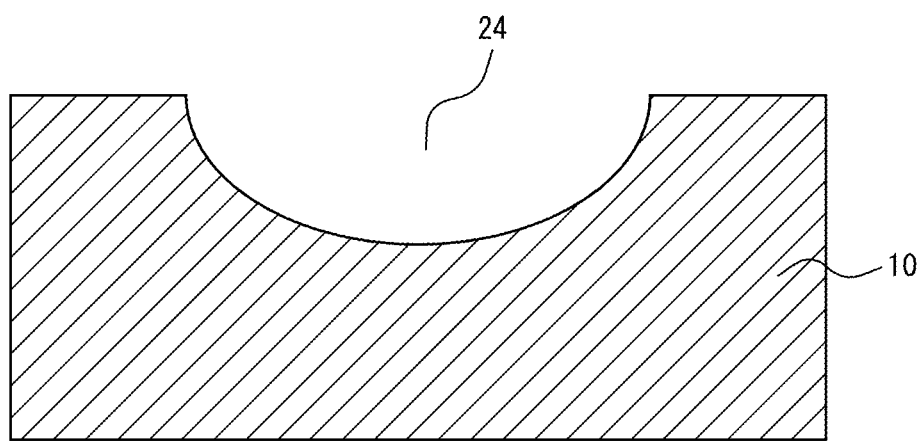
FIG. 5D is a cross-sectional view (No. 4) illustrating the method for fabricating the imprint master according to the comparative example 1.

Then, the substrate 10 is etched using the organic resist layer 26 having been developed as an etching mask (a first etching mask). In this way, a recess 24 corresponding to the latent image 26a is formed in the substrate 10, as illustrated in FIG. 5D. The etching of the substrate 10 may be either dry etching or wet etching. In a case in which the substrate 10 is a glass material mainly composed of $SiO_2$ (e.g., quartz glass, etc.), the substrate 10 can be etched by dry etching with carbon fluoride gas or wet etching with hydrofluoric acid or the like.

In the method for fabricating the imprint master described with reference to FIG. 5A to FIG. 5D, the recess 24 larger than the area of the spot SP of the laser beam 30 is simply formed as a protrusion-and-recess structure on the substrate 10. Therefore, the method for fabricating the imprint master described with reference to FIG. 5A to FIG. 5D has difficulty in fabricating the imprint master 1 in which the protrusion-and-recess structures with different average pitches are formed in a manner being superimposed on one another.

Next, a method for fabricating an imprint master in which an etching mask is formed by exposing and developing an inorganic resist layer by thermal lithography will be described with reference to FIG. 6A to FIG. 6D.

Figure 6A:
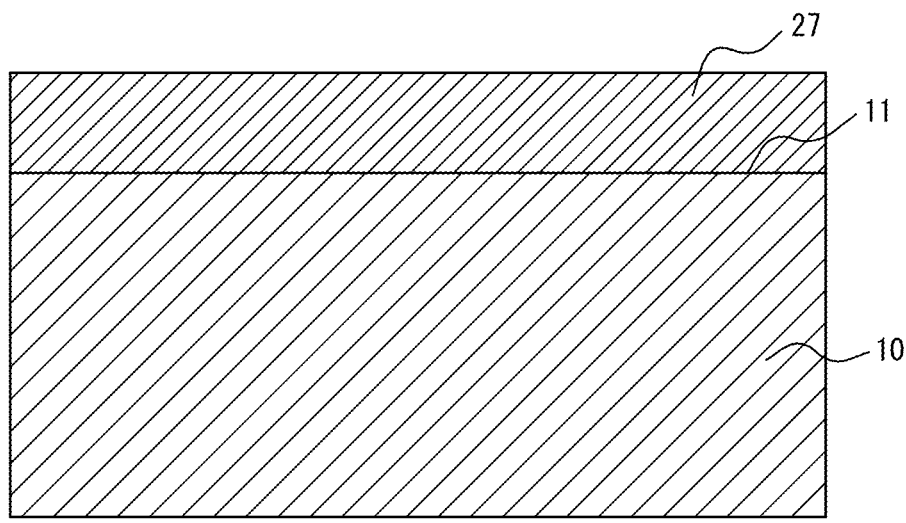
FIG. 6A is a cross-sectional view (No. 1) illustrating a method for fabricating an imprint master according to a comparative example 2.

An inorganic resist layer 27 formed of an inorganic material is deposited on the peripheral surface 11 serving as one surface of the substrate 10, as illustrated in FIG. 6A. The inorganic material forming the inorganic resist layer 27 may be, for example, a metal oxide containing one or more transition metals such as tungsten (W) or molybdenum (Mo). The inorganic material as described above can be deposited as the inorganic resist layer 27 by, for example, a sputtering method. In the present embodiment, the inorganic resist layer 27 is a positive resist.

Figure 6B:
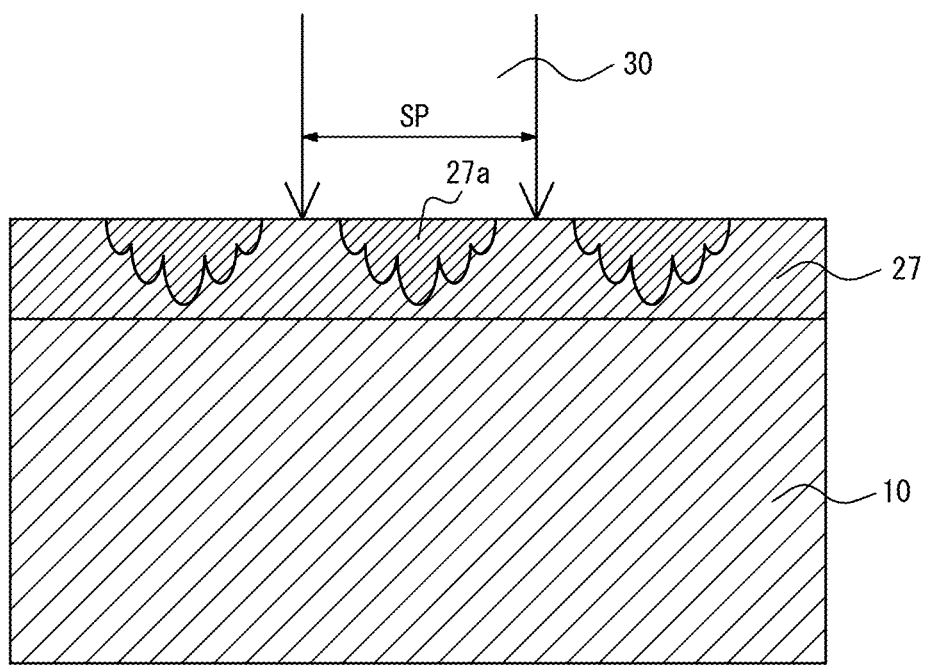
FIG. 6B is a cross-sectional view (No. 2) illustrating the method for fabricating the imprint master according to the comparative example 2.

Subsequently, the inorganic resist layer 27 deposited on the peripheral surface 11 of the substrate 10 is irradiated with the laser beam 30 and exposed by thermal lithography, as illustrated in FIG. 6B. The exposure can be performed using the exposure apparatus 3 described with reference to FIG. 4. During the thermal lithography, the inorganic resist layer 27 is changed in quality by heat of the laser beam 30 being radiated to form a latent image 27a. The laser beam 30 may be the same as the laser beam 30 used in the optical lithography described with reference to FIG. 5B.

Within the spot SP (the irradiation area) of the laser beam 30 being radiated, a temperature distribution is not uniform but uneven. Therefore, the inorganic resist layer 27 is changed in quality in a portion corresponding to the area of the spot SP of the laser beam 30 where the temperature is high, and thus the latent image 27a is formed. A depth of the latent image 27a is deeper in the portion where the temperature is higher. Accordingly, an area of the latent image 27a is narrower than the area of the spot SP of the laser beam 30, and the latent image 27a has a varied depth therein.

Figure 6C:
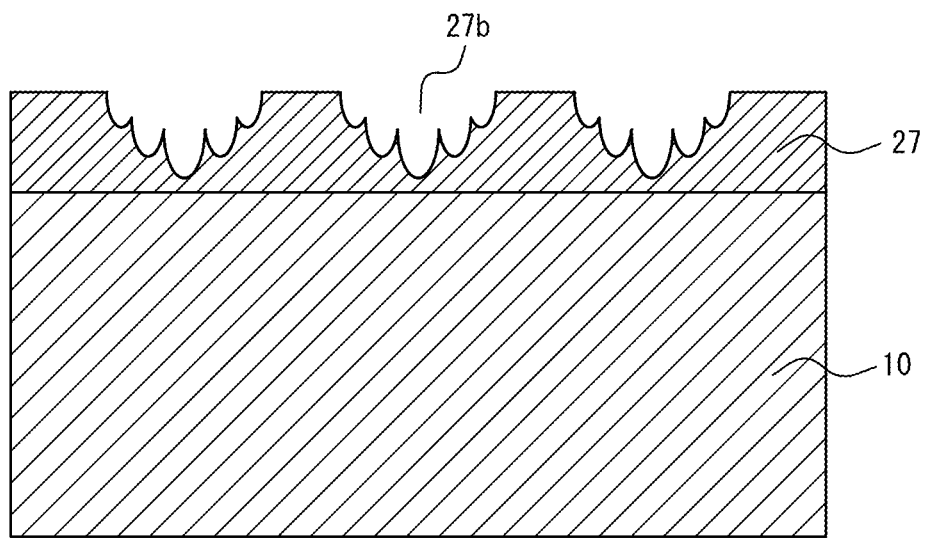
FIG. 6C is a cross-sectional view (No. 3) illustrating the method for fabricating the imprint master according to the comparative example 2.

Next, the inorganic resist layer 27 having the latent image 27a formed thereon is developed, whereby a recess 27b corresponding to the latent image 27a is formed in the inorganic resist layer 27, as illustrated in FIG. 6C. To develop the inorganic resist layer 27, the alkaline solution such as, for example, the TMAH aqueous solution can be used.

Figure 6D:
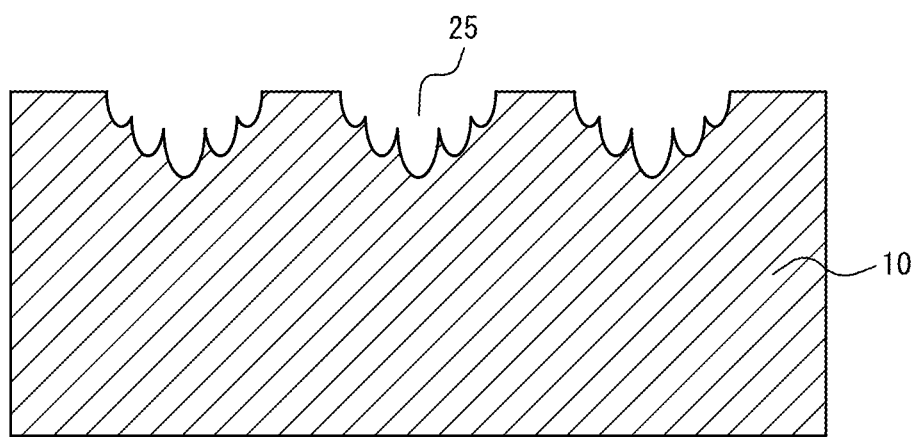
FIG. 6D is a cross-sectional view (No. 4) illustrating the method for fabricating the imprint master according to the comparative example 2.

Then, the substrate 10 is etched using the inorganic resist layer 27 having been developed as an etching mask. In this way, a recess 25 corresponding to the latent image 27a is formed in the substrate 10, as illustrated in FIG. 6D. The etching of the substrate 10 may be either dry etching or wet etching.

In the method for fabricating the imprint master described with reference to FIG. 6A to FIG. 6D, the recess 25 smaller than the area of the spot SP of the laser beam 30 is simply formed as a protrusion-and-recess structure on the substrate 10. Therefore, the method for fabricating the imprint master described with reference to FIG. 6A to FIG. 6D has difficulty in fabricating the imprint master 1 in which the protrusion-and-recess structures with different average pitches are formed in a manner being superimposed on one another.

Next, a method for fabricating the imprint master 1 according to the present embodiment will be described. Hereinafter, an example of fabricating the imprint master 1 having a protrusion-and-recess structure 20 in which the micro-protrusion-and-recess structures 23 are formed in the main recesses 21 as illustrated in FIG. 2A will be described.

The method for fabricating the imprint master 1 according to the present embodiment includes a first forming step and a second forming step. In the first forming step, the micro-protrusion-and-recess structures 23 having the predetermined average pitch P1 (the first average pitch) are formed on the peripheral surface 11 serving as one surface of the substrate 10. In the second forming step, the main recesses 21 or the main protrusions 22d having the predetermined average pitch P2 (the second average pitch) larger than the average pitch P1 are formed on the peripheral surface 11 of the substrate 10 having the micro-protrusion-and-recess structures 23 formed thereon. Here, in the second forming step, the main recesses 21 or the main protrusions 22 are formed in a manner maintaining a shape of at least a portion of the micro-protrusion-and-recess structures 23 in the main recesses 21 or the main protrusions 22. Hereinafter, the first and second forming steps will be described in more detail.

First, the first forming step will be described with reference to FIG. 7A to FIG. 7D.

Figure 7A:
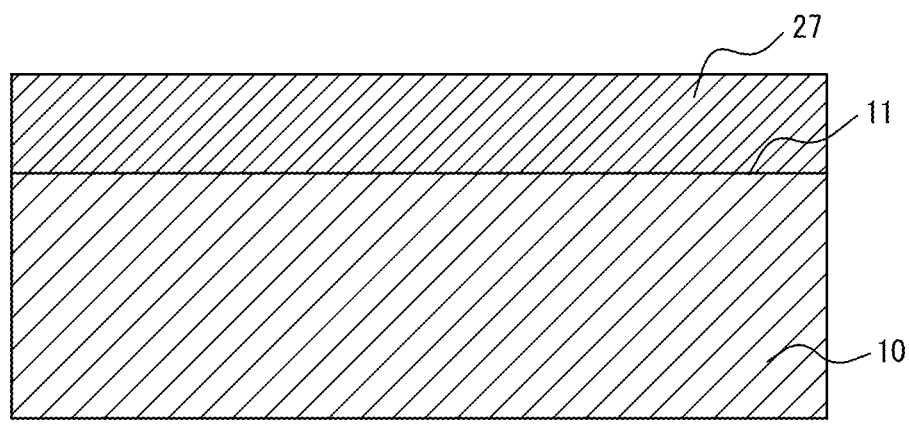
FIG. 7A is a cross-sectional view (No. 1) illustrating a method for fabricating an imprint master according to one embodiment of the present disclosure.

As illustrated in FIG. 7A, the inorganic resist layer 27 is deposited on the peripheral surface 11 serving as one surface of the substrate 10. The inorganic resist layer 27 can be deposited by, for example, the method described with reference to FIG. 6A.

Figure 7B:
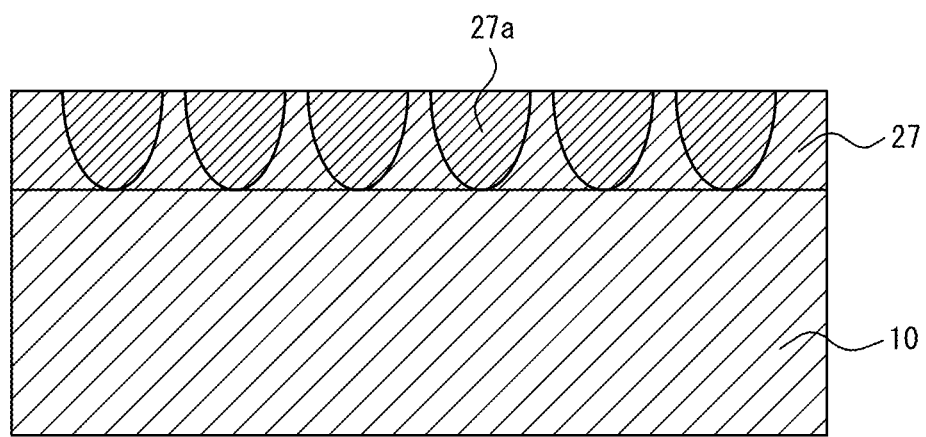
FIG. 7B is a cross-sectional view (No. 2) illustrating the method for fabricating the imprint master according to the one embodiment of the present disclosure.

Subsequently, the inorganic resist layer 27 deposited on the peripheral surface 11 of the substrate 10 is irradiated with the laser beam 30 (not illustrated) to expose the inorganic resist layer 27 by thermal lithography, as illustrated in FIG. 7B. The exposure can be performed using the exposure apparatus 3 described with reference to FIG. 4. The inorganic resist layer 27 is changed in quality by heat of the laser beam 30 being radiated to form the latent image 27a. As described above, the latent image 27a formed by the thermal lithography can be smaller in size than the spot SP of the laser beam 30. The latent image 27a is formed in a manner corresponding to the micro-protrusion-and-recess structure 23.

Figure 7C:
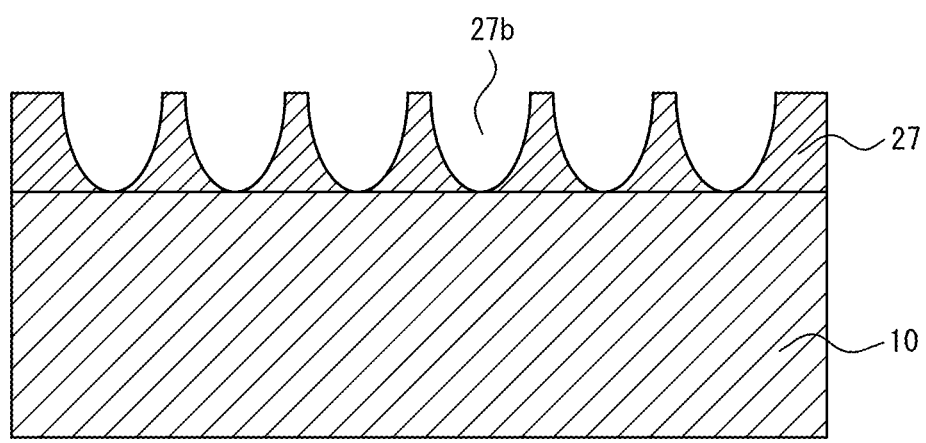
FIG. 7C is a cross-sectional view (No. 3) illustrating the method for fabricating the imprint master according to the one embodiment of the present disclosure.

Next, the inorganic resist layer 27 having the latent image 27a formed thereon is developed to form the recesses 27b corresponding to the latent images 27a in the inorganic resist layer 27, as illustrated in FIG. 7C. The development of the inorganic resist layer 27 can be performed by, for example, the method described with reference to FIG. 6C.

Figure 7D:
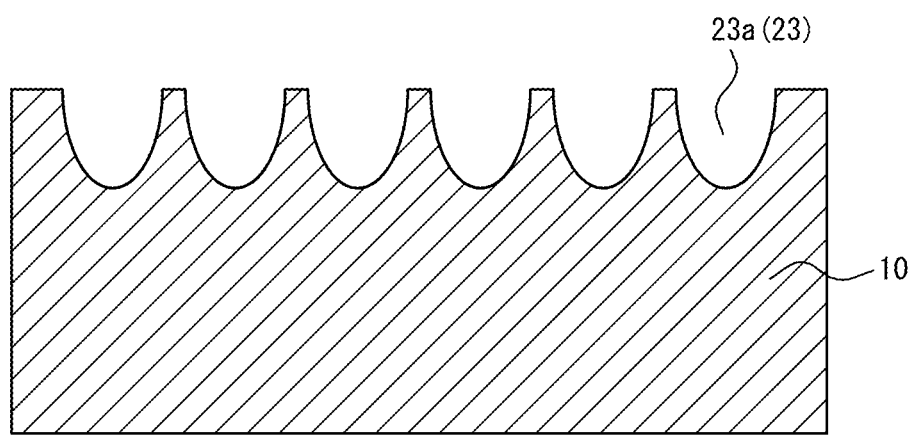
FIG. 7D is a cross-sectional view (No. 4) illustrating the method for fabricating the imprint master according to the one embodiment of the present disclosure.

Then, the substrate 10 is etched using the inorganic resist layer 27 having been developed as an etching mask (the first etching mask). In this way, recesses 23a corresponding to the latent images 27a are formed in the substrate 10, as illustrated in FIG. 7D. The recesses 23a correspond to the micro-protrusion-and-recess structures 23. The etching of the substrate 10 may be either dry etching or wet etching.

As described above, the first forming step includes a first deposition step (FIG. 7A), a first exposure step (FIG. 7B), a first development step (FIG. 7C), and a first etching step (FIG. 7D).

In the first deposition step, the inorganic resist layer 27 is deposited on the peripheral surface 11 serving as one surface of the substrate 10. In the first exposure step, the inorganic resist layer 27 is exposed by thermal lithography to form the latent images 27a corresponding to the micro-protrusion-and-recess structures 23. In the first development step, the inorganic resist layer 27 having the latent images 27a formed thereon is developed. In the first etching step, the substrate 10 is etched using the inorganic resist layer 27 having been developed as the etching mask (the first etching mask) to form the micro-protrusion-and-recess structures 23.

Next, the second forming step will be described with reference to FIG. 7E to FIG. 7H.

Figure 7E:
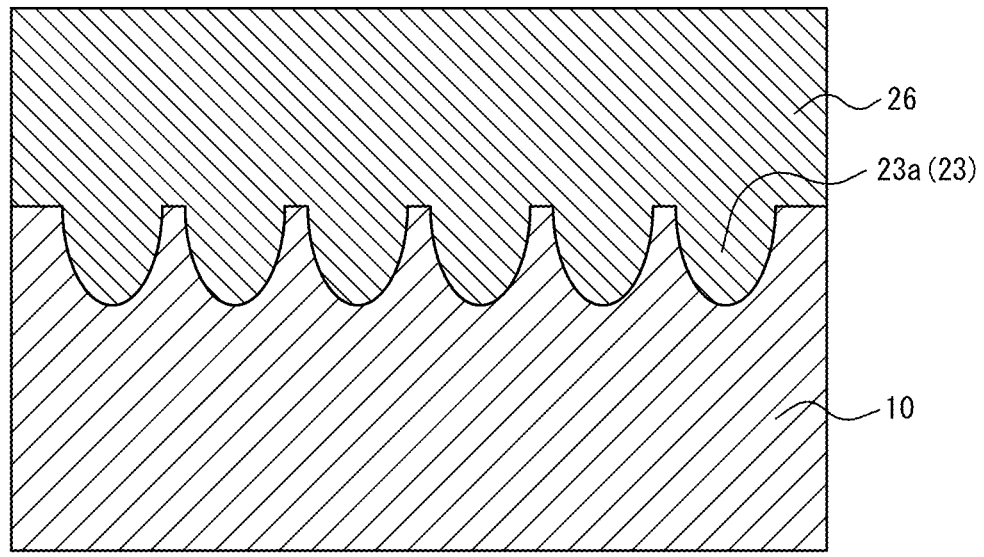
FIG. 7E is a cross-sectional view (No. 5) illustrating the method for fabricating the imprint master according to the one embodiment of the present disclosure.

As illustrated in FIG. 7E, the organic resist layer 26 is deposited on the peripheral surface 11 of the substrate 10 having the recesses 23a (the micro-protrusion-and-recess structures 23) formed thereon. The organic resist layer 26 can be deposited by, for example, the method described with reference to FIG. 5A.

Figure 7F:
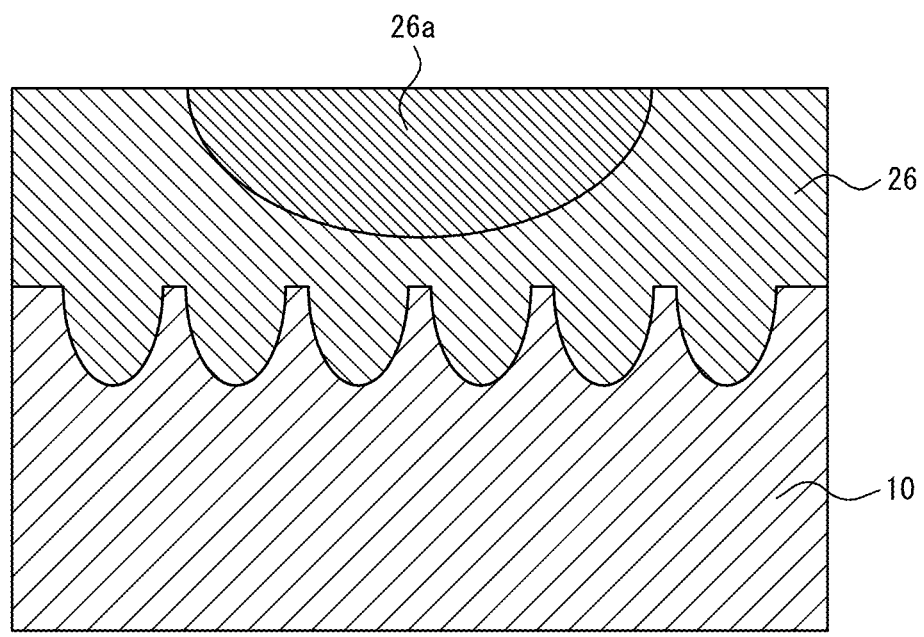
FIG. 7F is a cross-sectional view (No. 6) illustrating the method for fabricating the imprint master according to the one embodiment of the present disclosure.

Subsequently, the organic resist layer 26 deposited on the peripheral surface 11 of the substrate 10 is irradiated with the laser beam 30 (not illustrated) and exposed by optical lithography, as illustrated in FIG. 7F. The exposure can be performed using the exposure apparatus 3 described with reference to FIG. 4. The organic resist layer 26 is changed in quality by the irradiation of the laser beam 30 to form the latent image 26a. As described above, the latent image 26a formed by the optical lithography is larger in size than the spot SP of the laser beam 30. The latent image 26a is formed in a manner corresponding to the main recess 21.

Figure 7G:
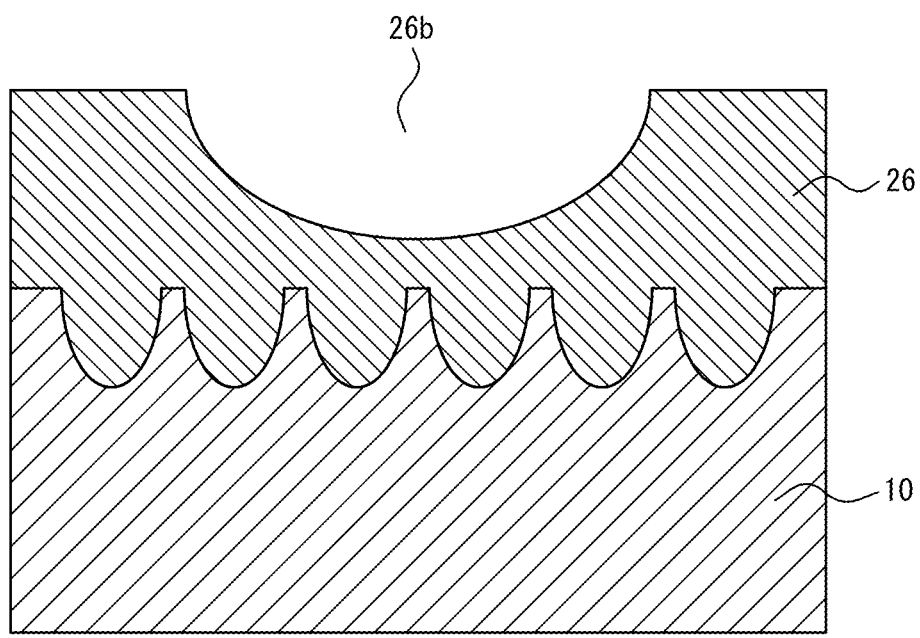
FIG. 7G is a cross-sectional view (No. 7) illustrating the method for fabricating the imprint master according to the one embodiment of the present disclosure.

Next, the organic resist layer 26 having the latent image 26a formed thereon is developed to form the recess 26b corresponding to the latent image 26a in the organic resist layer 26, as illustrated in FIG. 7G. The development of the organic resist layer 26 can be performed by, for example, the method described with reference to FIG. 5C.

Figure 7H:
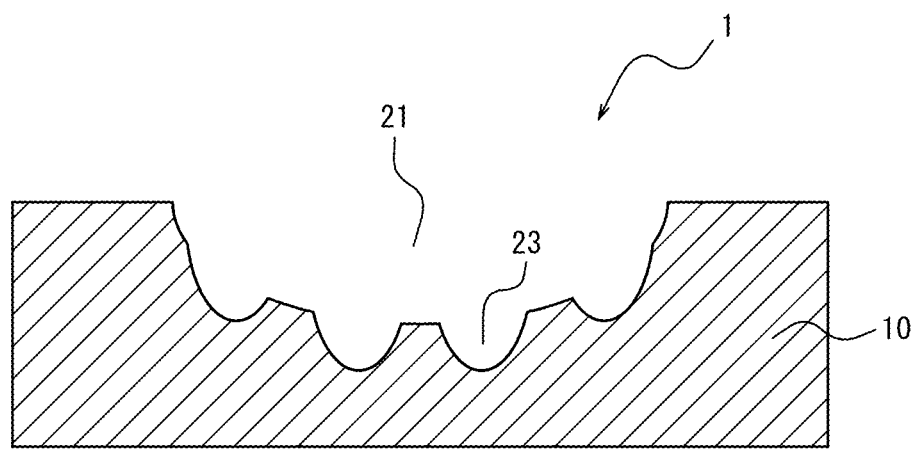
FIG. 7H is a cross-sectional view (No. 8) illustrating the method for fabricating the imprint master according to the one embodiment of the present disclosure.

Then, the substrate 10 is etched using the organic resist layer 26 having been developed as an etching mask (a second etching mask). In this way, the main recesses 21 are formed in the substrate 10, as illustrated in FIG. 7H. In the process illustrated in FIG. 7H, the substrate 10 is etched in a manner such that an etching rate of the organic resist layer 26 is greater than an etching rate of the substrate 10. By adjusting the etching rates of the organic resist layer 26 and the substrate 10 in this way, the main recesses 21 can be formed in the manner maintaining a shape of at least a portion of the recesses 23a (the micro-protrusion-and-recess structures 23) in the main recesses 21. Further, the micro-protrusion-and-recess structures 23 formed outside the main recess 21 can be removed. As a result, at least a portion of the recess 23a formed at a position corresponding to the main recess 21 is formed as the micro-protrusion-and-recess structure 23 in the main recess 21. That is, the substrate 10 having the main recesses 21 formed on the one surface (the peripheral surface 11) and the micro-protrusion-and-recess structures 23 formed in the main recesses 21 is fabricated.

As described above, the second forming step includes a second deposition step (FIG. 7E), a second exposure step (FIG. 7F), a second development step (FIG. 7G), and a second etching step (FIG. 7H).

In the second deposition step, the organic resist layer 26 is deposited on the peripheral surface 11 serving as one surface of the substrate 10 having the recesses 23a (the micro-protrusion-and-recess structures 23) formed thereon. In the second exposure step, the organic resist layer 26 is exposed by optical lithography to form the latent image 26a corresponding to the main recess 21. In the second development step, the organic resist layer 26 having the latent image 26a formed thereon is developed. In the second etching step, the substrate 10 is etched using the organic resist layer 26 having been developed as the etching mask (the second etching mask) to form the main recess 21. In the second etching step, here, the main recess 21 is formed in a manner maintaining a shape of at least a portion of the recesses 23a (the micro-protrusion-and-recess structures 23) in the main recess 21.

Note that the latent image 26a formed by exposure and development of the organic resist layer 26 is not limited to the example illustrated in FIG. 7F.

Figure 8A:
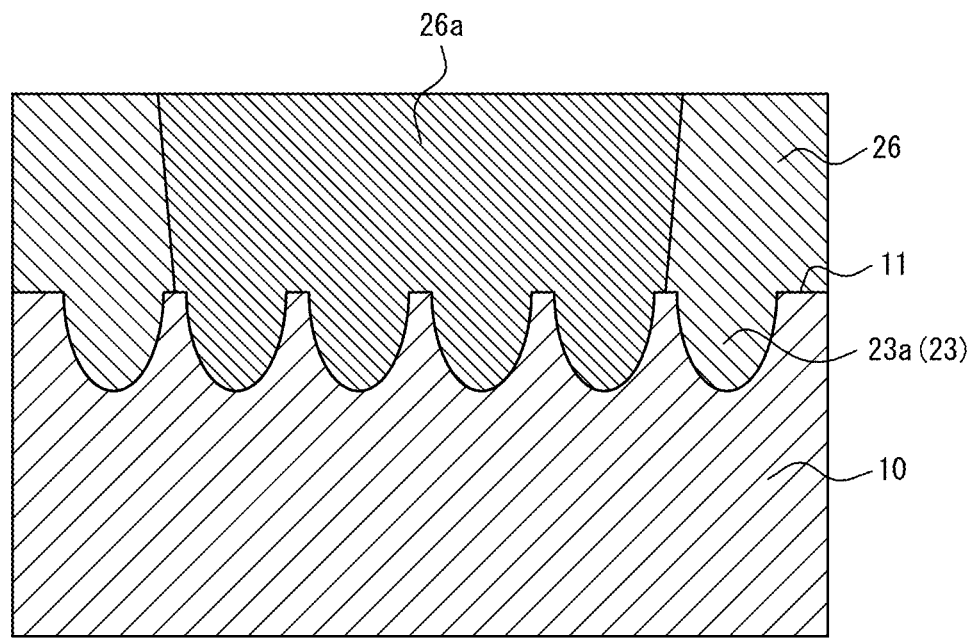
FIG. 8A is a cross-sectional view (No. 1) illustrating another example of the method for fabricating the imprint master according to one embodiment of the present disclosure.

The latent image 26a may be formed from a surface of the organic resist layer 26 all the way to the peripheral surface 11 of the substrate 10, as illustrated in FIG. 8A. In this case, a wall surface of the latent image 26a may be formed to be approximately perpendicular to the peripheral surface 11 of the substrate 10. The steps up to the deposition of the organic resist layer 26 are the same as that described with reference to FIG. 7A to FIG. 7E, and thus a description thereof will be omitted.

Figure 8B:
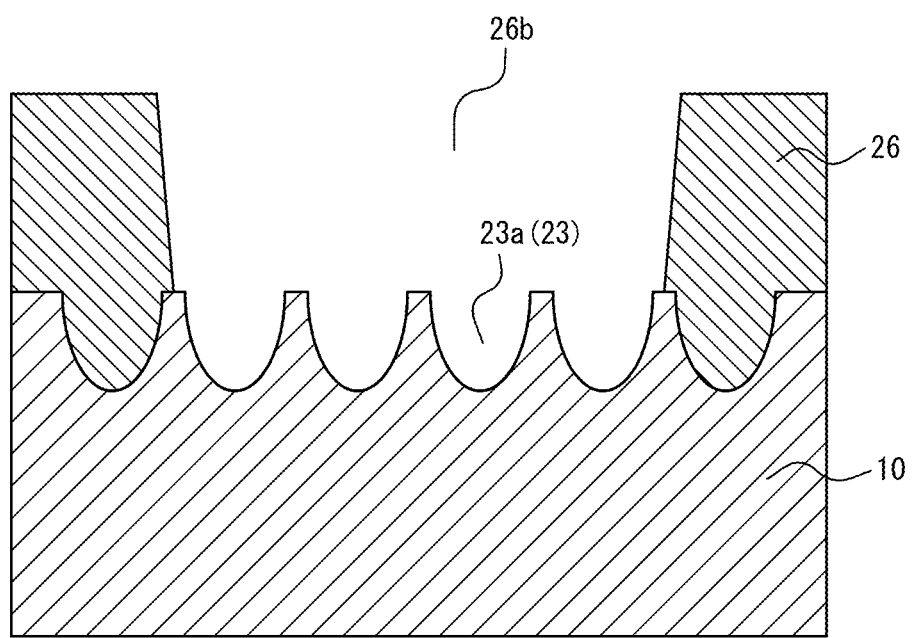
FIG. 8B is a cross-sectional view (No. 2) illustrating the another example of the method for fabricating the imprint master according to the one embodiment of the present disclosure.

After the latent image 26a illustrated in FIG. 8A is formed, the organic resist layer 26 is developed to form the recess 26b reaching the substrate 10 in the organic resist layer 26, as illustrated in FIG. 8B. A wall surface of the recess 26b is approximately perpendicular to the peripheral surface 11 of the substrate 10.

Figure 8C:
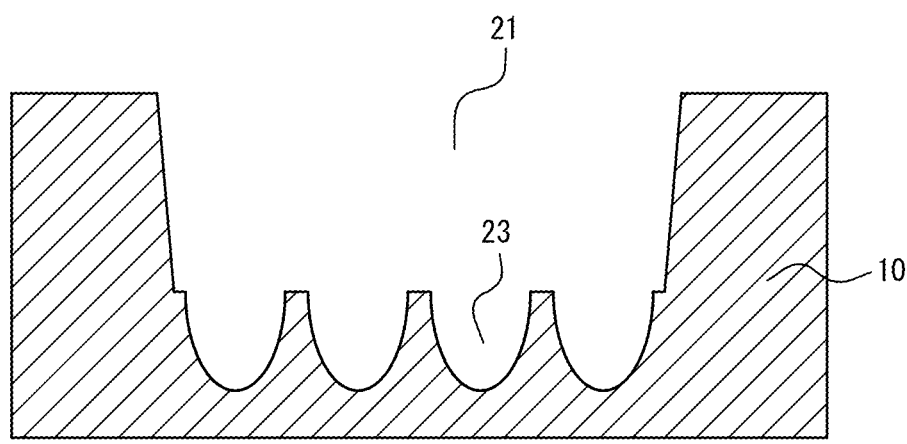
FIG. 8C is a cross-sectional view (No. 3) illustrating the another example of the method for fabricating the imprint master according to the one embodiment of the present disclosure.

By performing etching using the organic resist layer 26 having been developed as an etching mask, the substrate 10 having the micro-protrusion-and-recess structures 23 formed in the main recesses 21 as illustrated in FIG. 8C can be fabricated. That is, the imprint master 1 that includes the substrate 10 with one surface (the peripheral surface 11) having the main recess 21 formed thereon in which the micro-protrusion-and-recess structures 23 are formed can be fabricated. Note that the substrate 10 in FIG. 8C is different from the substrate 10 illustrated in FIG. 7H in terms of having the wall surface of the main recess 21 approximately perpendicular to the peripheral surface 11 of the substrate.

In developing the organic resist layer 26 illustrated in FIG. 8B, because the organic resist layer 26 is a negative resist, a portion thereof other than the latent image 26a can be removed. Then, by etching the substrate 10, etching proceeds from the portion other than the latent image 26a, whereby the substrate 10 having the micro-protrusion-and-recess structures 23 formed in the main protrusions 22 as illustrated in FIG. 2B can be fabricated.

As described above, the method for fabricating the imprint master 1 according to the present embodiment includes the first forming step and the second forming step. In the first forming step, the micro-protrusion-and-recess structures 23 with the average pitch P1 (the first average pitch) are formed on the one surface (the peripheral surface 11) of the substrate 10. In the second forming step, the main recesses 21 or the main protrusions 22 with the average pitch P2 (the second average pitch P2) larger than the average pitch P1 are formed on the one surface (the peripheral surface 11) of the substrate 10 having the micro-protrusion-and-recess structures 23 formed thereon. In the second forming step, the main recesses 21 are formed in a manner maintaining a shape of at least a portion of the micro-protrusion-and-recess structures 23 in the main recess 21 or the main protrusion 22.

Since the main recesses 21 or the main protrusions 22 are formed in the manner maintaining the shape of the micro-protrusion-and-recess structures 23 in the main recess 21 or the main protrusions 22, the imprint master 1 having the protrusion-and-recess structures with different average pitches formed thereon in a manner being superimposed on one another can be fabricated. By using this imprint master 1, further, an imprint having the protrusion-and-recess structures with different average pitches being superimposed on one another imprinted thereto and an article including such an imprint can be manufactured.

EMBODIMENTS

Next, the present disclosure will be described in more detail using embodiments. However, the present disclosure is not limited to the embodiments described below.
Fabrication of Imprint Master First Embodiment An imprint master according to a first embodiment was fabricated by a process described below. First, a tungsten oxide film with a thickness of 55 nm was formed by a sputtering method on a peripheral surface of a substrate formed of cylindrical quartz glass (with an axial length of 100 mm, a diameter of φ132, and a thickness of 4.5 mm), whereby an inorganic resist layer was formed. Subsequently, thermal lithography was performed using a laser beam with a wavelength of 405 nm from the semiconductor laser source of the exposure apparatus 3 illustrated in FIG. 4 to form a latent image corresponding to the micro-protrusion-and-recess structure 23 on the inorganic resist layer. A revolution speed of the substrate was 900 rpm.

Subsequently, the substrate having been exposed was developed in 2.38 mass % of TMAH aqueous solution (manufactured by TOKYO OHKA KOGYO CO., LTD.) at 27° C. for 900 seconds to dissolve the inorganic resist layer in the latent image and thus form a recess in the inorganic resist layer. Then, reactive ion etching (Reactive Ion Etching: RIE) was performed using the inorganic resist layer having been developed as an etching mask together with $CHF_3$ gas (30 sccm) at a gas pressure of 0.5 Pa and power input of 150 W to etch the substrate for 30 minutes. After that, a remained inorganic resist layer was removed.

Subsequently, an AZ4210 positive resist with a thickness of 5 μm was deposited by a dip-coating method on the peripheral surface of the substrate from which the inorganic resist layer had been removed. Then, optical lithography was performed by a laser beam with a wavelength of 405 nm from the semiconductor laser source of the exposure apparatus illustrated in FIG. 4 to form a latent image corresponding to the main recess 21 in the organic resist layer. A revolution speed of the substrate was 900 rpm. In the present embodiment, the latent image having a semicircular shape in cross-sectional view was formed as illustrated in FIG. 7F.

Next, the substrate having been exposed was developed in 2.38 mass % of TMAH aqueous solution (manufactured by TOKYO OHKA KOGYO CO., LTD.) at 27° C. for 180 seconds to dissolve the organic resist layer in the latent image and thus form a recess in the organic resist layer. Then, reactive ion etching (Reactive Ion Etching: RIE) was performed using the organic resist layer having been developed as an etching mask together with $CHF_3$ gas (30 sccm) at the gas pressure of 0.5 Pa and power input of 150 W to etch the substrate for 300 minutes. After that, a remained organic resist layer was removed.

In this way, the imprint master with the peripheral surface in which the protrusion-and-recess structures were formed was fabricated.

Second Embodiment

In the present embodiment, a latent image that reaches the peripheral surface of the substrate and has a wall surface approximately perpendicular to the peripheral surface of the substrate was formed as the latent image formed in the organic resist layer as illustrated in FIG. 8A, in lieu of the latent image having the semi-circular shape in a cross-sectional view illustrated in FIG. 7F. The other steps were the same as those of the first embodiment, whereby an imprint master according to the second embodiment was fabricated.

Comparative Example 1

In a comparative example 1, an imprint master was fabricated by the steps described with reference to FIG. 5A to FIG. 5D.

In particular, an inorganic resist layer was deposited on the peripheral surface of the same substrate as that of the first embodiment by the same method as that of the first embodiment. Next, thermal lithography was performed by the same method as that of the first embodiment to form a latent image on the inorganic resist layer. Then, the inorganic resist layer was developed and etched by the same method as that of the first embodiment to fabricate the imprint master according to the comparative example 1.

Comparative Example 2

In a comparative example 2, an imprint master was fabricated by the steps described with reference to FIG. 6A to FIG. 6D.

In particular, an organic resist layer was deposited on the peripheral surface of the same substrate as that of the first embodiment by the same method as that of the first embodiment. Next, optical lithography was performed by the same method as that of the first embodiment to form a latent image on the organic resist layer. Then, the organic resist layer was developed and etched by the same method as that of the first embodiment to fabricate the imprint master according to the comparative example 2.

Manufacture of Imprint

Imprints were manufactured with the imprint masters according to the first and second embodiments and the comparative examples 1 and 2. In particular, protrusion-and-recess structures formed on the peripheral surface of the imprint master were imprinted to a UV-curable resin using the imprint apparatus 5 illustrated in FIG. 3. A polyethylene terephthalate (PolyEthylene Terephthalate: PET) film was used as the sheet-like substrate for the imprint. The UV curable resin was cured by irradiating 1000 $mJ/cm^2$ of ultraviolet rays for 1 minute with a metal halide lamp.

Evaluation Results

Figure 9A:
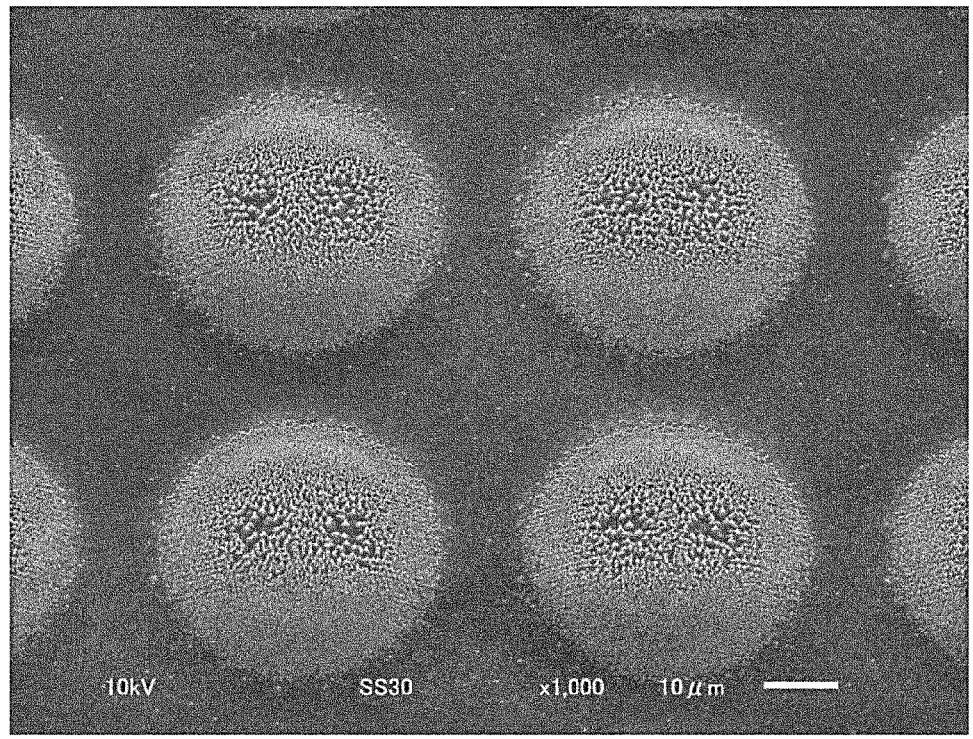
FIG. 9A is a SEM image capturing an imprint by an imprint master according to a first embodiment.
Figure 9B:
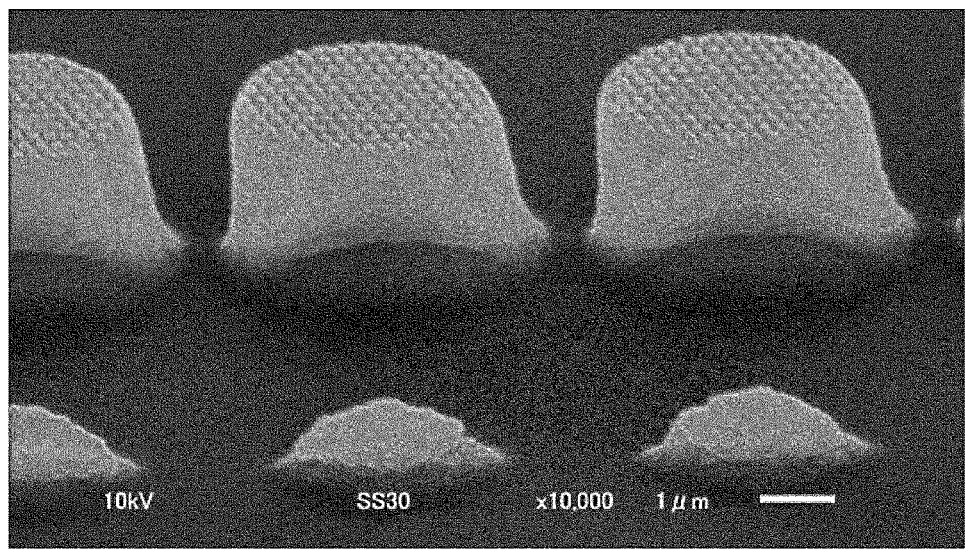
FIG. 9B is a SEM image capturing an imprint by an imprint master according to a second embodiment.
Figure 10A:
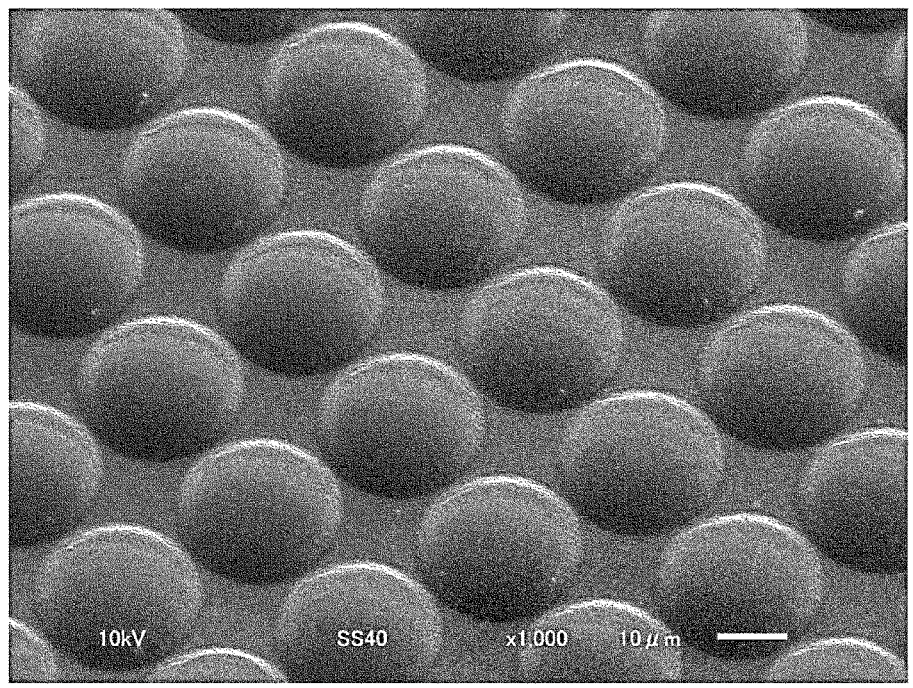
FIG. 10A is a SEM image capturing an imprint by an imprint master according to the comparative example 1.
Figure 10B:
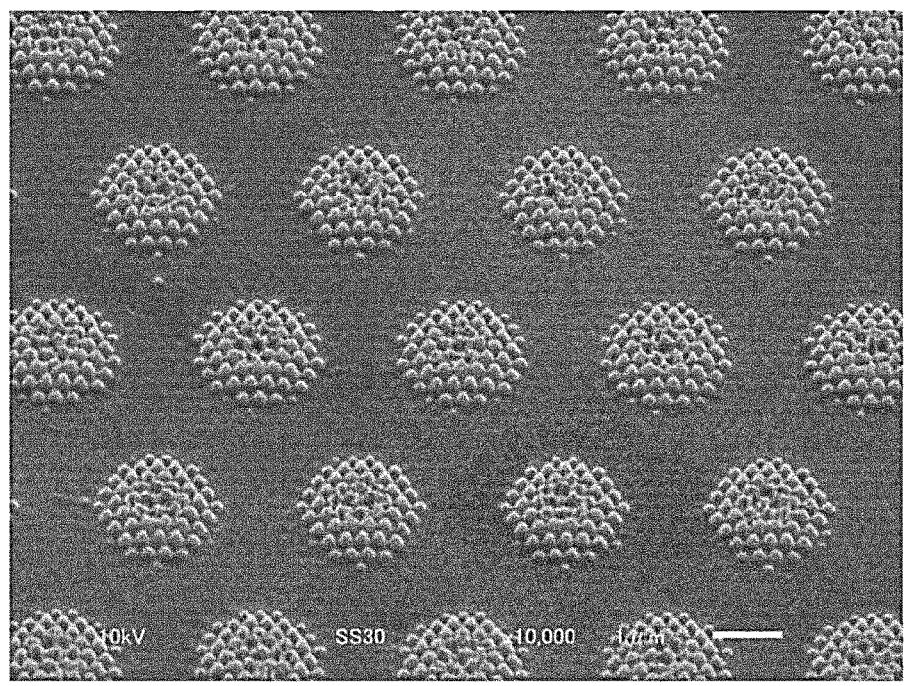
FIG. 10B is a SEM image capturing an imprint by an imprint master according to the comparative example 2.

Images of the imprints manufactured in the first and second embodiments and the comparative examples 1 and 2 observed using a scanning electron microscope (Scanning Electron Microscope: SEM) are illustrated in FIG. 9A, FIG. 9B, FIG. 10A and FIG. 10B. FIG. 9A is a SEM image of the imprint manufactured with the imprint master according to the first embodiment at a magnification of 1000×. FIG. 9B is a SEM image of the imprint manufactured with the imprint master according to the second embodiment at a magnification of 10000×. FIG. 10A is a SEM image of the imprint manufactured with the imprint master according to the comparative example 1 at a magnification of 1000×. FIG. 10B is a SEM image of the imprint manufactured with the imprint master according to the comparative example 2 at a magnification of 10000×.

Referring to FIG. 9A and FIG. 9B, in the imprints manufactured with the imprint masters according to the first and second embodiments, micro-protrusion structures with a height of several hundred nanometers were formed on each of a plurality of main protrusions with a height of several micrometers. For example, in the imprint manufactured with the imprint master according to the first embodiment, the micro-protrusion structures with a height of approximately 200 nm was formed on top of the main protrusions with a height of approximately 2.6 μm. Therefore, it was found that protrusion-and-recess structures with different average pitches were formed in a manner being superimposed on one another in the imprints manufactured with the imprint masters according to the first and second embodiments.

Referring to FIG. 10A, on the other hand, in the imprint manufactured with the imprint master according to the comparative example 1, protrusions with a height of approximately 3.2 μm were simply formed without a protrusion-and-recess structure with an average pitch different from that of these protrusions. Referring to FIG. 10B, also, in the imprint manufactured with the imprint master according to the comparative example 2, protrusions with a height of approximately 200 nm were simply formed without a protrusion-and-recess structure with an average pitch different from that of these protrusions.

Although the present disclosure has been described based on the drawings and the embodiments, it should be appreciated that a person skilled in the art can easily make various variations or modifications based on the present disclosure. Accordingly, it should be understood that such variations or modifications are included in the scope of the present disclosure.

REFERENCE SIGNS LIST

1 Imprint master
3 Exposure apparatus
5 Exposure apparatus
10 Substrate
11 Peripheral surface
20 Protrusion-and-recess structure
21 Main recess
22 Main protrusion
23 Micro-protrusion-and-recess structure
23a Recess
24, 25 Recess of substrate
26 Organic resist layer
26a, 27a Latent image
26b Recess of organic resist layer
27 Inorganic resist layer 27b Recess of inorganic resist layer
30 Laser beam
31 Laser source
33 First mirror
34 Photodiode
36 Condensing lens
38 Collimating lens
39 Electro-optic deflector
41 Second mirror
43 Beam expander
44 Objective lens
45 Spindle motor
46 Turntable
47 Control mechanism
48 Formatter
49 Driver
51 Substrate supply roll
52 Take-up roll
53, 54 Guide roll
55 Nip roll
56 Peeling roll
57 Coating apparatus
58 Light source
61 Sheet-like substrate
62 Resin layer

The invention claimed is:

1. A method for fabricating an imprint master comprising:
a first forming step of forming micro-protrusion-and-recess structures having a first average pitch on one surface of a substrate; and
a second forming step of forming main recesses or main protrusions having a second average pitch larger than the first average pitch on the one surface of the substrate having the micro-protrusion-and-recess structures formed thereon, in a manner maintaining a shape of at least a portion of the micro-protrusion-and-recess structures in the main recesses or the main protrusions while the main recesses or the main protrusions are being formed, wherein
the first forming step comprising:
a first deposition step of depositing an inorganic resist layer on the one surface of the substrate;
a first exposure step of exposing the inorganic resist layer by thermal lithography to form a latent image corresponding to the micro-protrusion-and-recess structure;
a first developing step of developing the inorganic resist layer having the latent image formed thereon; and
a first etching step of etching the substrate using the inorganic resist layer having been developed as a first etching mask to form the micro-protrusion-and-recess structure, and
the second forming step comprising:
a second deposition step of depositing an organic resist layer on the one surface of the substrate having the micro-protrusion-and-recess structure formed thereon;
a second exposure step of exposing the organic resist layer by optical lithography to form a latent image corresponding to the main recess or the main protrusion;
a second developing step of developing the organic resist layer having the latent image formed thereon; and
a second etching step of etching the substrate using the organic resist layer having been developed as a second etching mask to form the main recess or the main protrusion, wherein
in the second etching step, an etching rate of the organic resist layer is greater than an etching rate of the substrate, and the substrate is etched until micro-protrusion-and-recess structures other than the portions corresponding to the main recesses or the main protrusions are removed.

2. The method for fabricating the imprint master according to claim 1,
wherein the first average pitch is equal to or smaller than the wavelength of visible light; and
the second average pitch is larger than the wavelength of visible light.

* * * * *